(12) United States Patent
Sullivan et al.

(10) Patent No.: US 11,209,485 B2
(45) Date of Patent: Dec. 28, 2021

(54) LOW POWER ACTIVE LOAD

(71) Applicant: ELEVATE SEMICONDUCTOR, INC., San Diego, CA (US)

(72) Inventors: Patrick G. Sullivan, Forestville, CA (US); Kangfei Zhou, San Diego, CA (US)

(*) Notice: Subject to any disclaimer, the term of this patent is extended or adjusted under 35 U.S.C. 154(b) by 89 days.

(21) Appl. No.: 16/476,034

(22) PCT Filed: Jan. 8, 2018

(86) PCT No.: PCT/US2018/012837
§ 371 (c)(1),
(2) Date: Jul. 3, 2019

(87) PCT Pub. No.: WO2018/129477
PCT Pub. Date: Jul. 12, 2018

(65) Prior Publication Data
US 2019/0346507 A1    Nov. 14, 2019

Related U.S. Application Data

(60) Provisional application No. 62/443,505, filed on Jan. 6, 2017.

(51) Int. Cl.
*G01R 31/319*    (2006.01)
*H03F 1/00*    (2006.01)
*H01L 21/00*    (2006.01)

(52) U.S. Cl.
CPC .............. *G01R 31/31924* (2013.01)

(58) Field of Classification Search
CPC .... G01R 1/00; H03K 3/00; G06F 1/00; H01L 21/00; H01L 2221/00; H03F 1/00; H03F 2200/00
See application file for complete search history.

(56) References Cited

U.S. PATENT DOCUMENTS

| 5,010,297 | A |   | 4/1991  | Babcock |
| 5,436,911 | A | * | 7/1995  | Mori ..................... G11C 29/34 |
|           |   |   |         | 365/185.21 |
| 5,493,519 | A |   | 2/1996  | Allen, III |
| 5,945,822 | A |   | 8/1999  | Shiotsuka |
| 6,166,569 | A |   | 12/2000 | McQuilkin |
| 6,211,723 | B1 |  | 4/2001  | Creek |
| 6,232,815 | B1 | * | 5/2001 | Turvey ............. G01R 31/31924 |
|           |   |   |         | 327/106 |

(Continued)

*Primary Examiner* — Jermele M Hollington
*Assistant Examiner* — Temilade S Rhodes-Vivour

(57) ABSTRACT

An active load circuit that includes a diode bridge having first through fourth nodes, wherein a voltage buffer is connected with the first node, a source current mirror is connected with the second node, the third node is configured for connection to a device under test (DUT), and a sink current mirror is connected with the fourth node. A first current mirror is connected with the source current mirror, and a second current mirror is connected with the sink current mirror. A first differential pair is connected with the first current mirror and includes an input connected with the DUT and a second input connected with the input voltage. A second differential pair is connected with the second current mirror and includes a first input connected with the DUT and a second input connected with the input voltage.

16 Claims, 3 Drawing Sheets

(56) References Cited

U.S. PATENT DOCUMENTS

| | | | |
|---|---|---|---|
| 6,275,023 B1 * | 8/2001 | Oosaki | G01R 31/31924 324/756.06 |
| 6,717,450 B1 | 4/2004 | Linder | |
| 9,001,610 B2 * | 4/2015 | Kodama | H03K 19/0016 365/226 |
| 2007/0296391 A1 * | 12/2007 | Bertin | G01R 35/005 323/303 |
| 2016/0079944 A1 * | 3/2016 | Schaffer | H03F 3/45475 330/261 |

* cited by examiner

LOW POWER ACTIVE LOAD

BACKGROUND OF THE INVENTION

Technical Field

The present invention relates to semiconductor automated test equipment using active loads, and more particularly to a low power active load circuit for use on a highly integrated system-on-a-chip pin electronic IC for automated test equipment and ASIC verification, wherein the improved circuit decreases the power dissipation in a standard active load circuit without adversely affecting the DC/AC performance of the active load.

Background Art

Active loads are found on products such as the ADATE320 by Analog Devices, Inc., of Norwood, Mass., and the MAX9979 by Maxim Integrated, of San Jose, Calif. They are also found on the ISL55161 and ISL55163, by ElevATE Semiconductor, of San Diego, Calif.

A typical prior art active load circuit may be seen in FIG. 1. This circuit works reasonably well, and it is commonly bundled with a driver, comparator, and PPMU to create a full pin electronics channel. As pin counts rise, however, density of the boards hosting the pin electronics rises. In order to successfully power and cool these dense pin electronics boards, it is necessary to minimize power dramatically.

DISCLOSURE OF INVENTION

Accordingly, the present invention decreases the power dissipation in a standard active load circuit without adversely affecting the DC/AC performance of the active load. With lower power dissipation it becomes possible to achieve higher density ATE systems. In addition to density, voltage requirements have increased making it even more necessary to reduce overall current in the pin electronics.

According to a first aspect of the present invention, there is provided an active load circuit for performing tests on Device Under Test (DUT), comprising a diode bridge having a first, a second, a third and a fourth node, the first node being opposite to the third node and the second node being opposite to the fourth node, wherein a voltage buffer configured to buffer an input voltage is connected with the first node, a source current mirror is connected with the second node, and a sink current mirror is connected with the fourth node. Next, a first current mirror is connected with the source current mirror, and a second current mirror is connected with the sink current mirror. A first differential pair includes first and second inputs and is connected with the first current mirror. It is fed a first biasing current from a first constant current source. A second differential pair includes third and fourth inputs and is connected with the second current mirror. The second differential pair is fed a second biasing current from a second constant current source.

In an embodiment, the third node is configured for connection to the DUT.

In an embodiment of the invention, the first input is configured for connection with the input voltage, and the second input is configured for connection with the DUT.

In one embodiment of the invention, the third input is configured for connection with the input voltage, and the fourth input is configured for connection with the DUT.

In an embodiment, the first constant current source is a constant current circuit, and the second constant current source is a constant current circuit.

A chain of connections may be interposed between the source current mirror, the first current mirror, and the first differential pair, and may take a configuration selected from a group consisting of series-series connections, series-parallel connections, parallel-series connections, and parallel-parallel connections.

Furthermore, in an embodiment, a chain of connections between the sink current mirror, the second current mirror, and the second differential pair may take a configuration selected from a group consisting of series-series connections, series-parallel connections, parallel-series connections, and parallel-parallel connections.

The voltage buffer may be a unity gain buffer.

In embodiments, the first current mirror and the first differential pair each include a pair of transistors, and the pairs of transistors of the first current mirror and the first differential pair each comprise MOSFET type transistors.

In an embodiment, the MOSFET type transistors are p-channel MOSFETS.

In an embodiment, the second current mirror and the second differential pair each comprise a pair of transistors each.

In an embodiment, the pairs of transistors of the second current mirror and the second differential pair comprise MOSFET type transistors, and the MOSFET type transistors may be n-channel MOSFETS.

According to a second aspect of the present invention, there is provided an active load circuit for performing tests on Device under Test (DUT). The circuit includes a diode bridge having first through fourth nodes, the first and third nodes configured in opposing relationships and the second and fourth nodes in opposing relationships. A voltage buffer configured to buffer an input voltage is connected with the first node, a source current mirror is connected with the second node, the third node is configured to be connected with the DUT, and a sink current mirror is connected with the fourth node, a first current mirror connected with the source current mirror and a second current mirror connected with the sink current mirror, a first differential pair connected with the first current mirror, the first differential pair being fed a first biasing current from a first constant current source, wherein the first differential pair has a first input and a second input, the first input being configured to be connected with the input voltage and the second input being configured to be connected with the DUT and a second differential pair connected with the second current mirror, the second differential pair being fed a second biasing current from a second constant current source, wherein the second differential pair has a third input and a fourth input, the third input being configured to be connected with the input voltage and the fourth input being configured to be connected with the DUT.

Other novel features which are characteristic of the invention, as to organization and method of operation, together with further objects and advantages thereof will be better understood from the following description considered in connection with the accompanying drawing, in which preferred embodiments of the invention are illustrated by way of example. It is to be expressly understood, however, that the drawing is for illustration and description only and is not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

BRIEF DESCRIPTION OF THE DRAWINGS

The invention will be better understood and objects other than those set forth above will become apparent when consideration is given to the following detailed description thereof. Such description makes reference to the annexed drawings wherein.

BEST MODE FOR CARRYING OUT THE INVENTION

Figure 1:
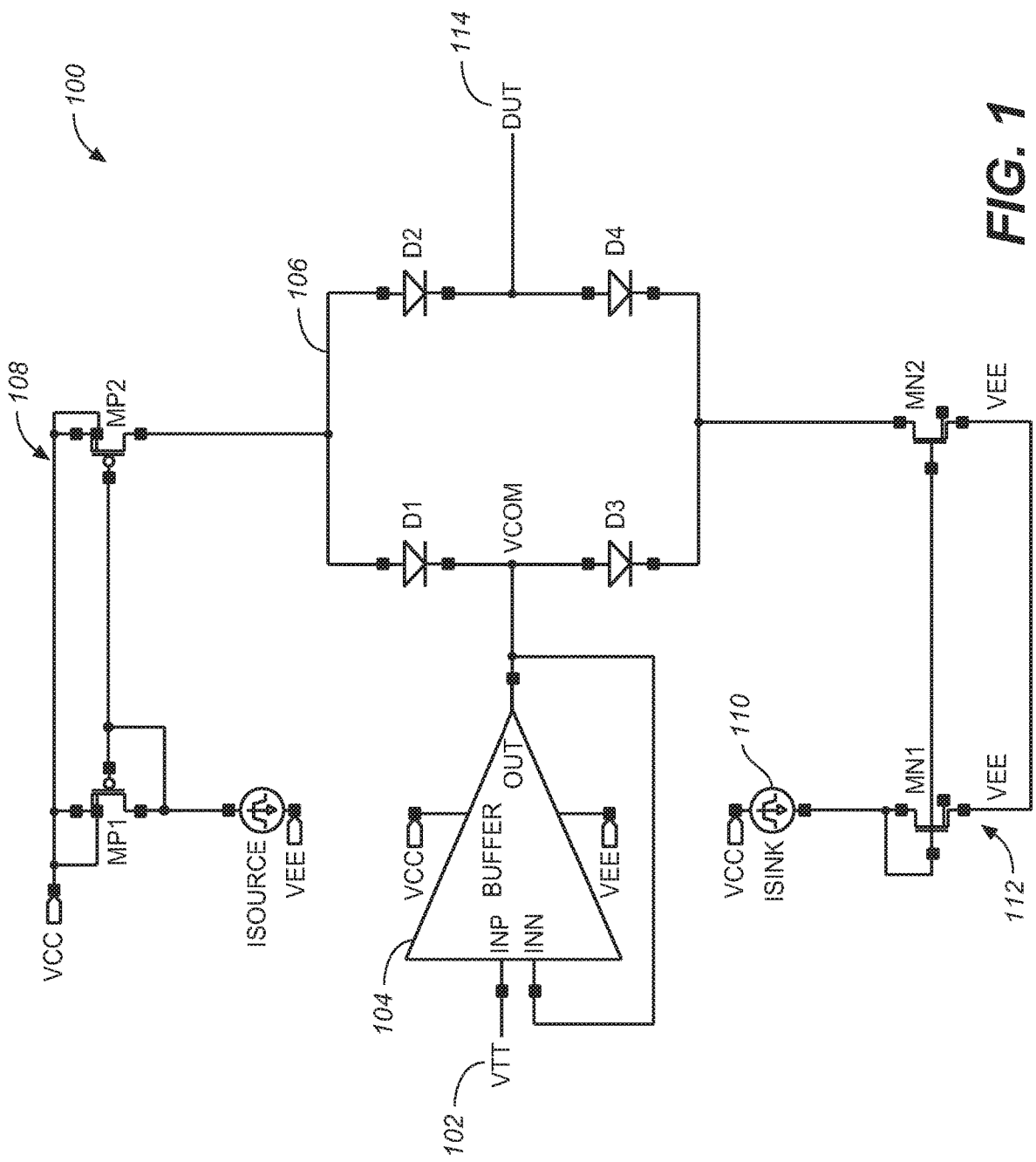
FIG. 1 illustrates a typical prior art active load circuit.

FIG. 1 illustrates a typical prior art active load circuit 100. In this circuit a voltage VTT 102 is forced by unity gain buffer (BUFFER) 104 to one side of a diode bridge 106 made up of diodes D1 . . . D4. A source current from 0 to Imax is fed into current mirror 108 made up of MP1, MP2. An independent sink current 110 is fed into current mirror 112 made up of MN1, MN2. The pin DUT 114 is connected to the Device Under Test (DUT).

When the DUT forces a voltage equal to VTT, Diodes D1 and D2 will both be on (PN junction is forward bias), and programmed source current will flow in D1 and D2 in equal amounts. Fifty percent (50%) of the programmed source current will flow into the buffer and fifty percent (50%) will flow into the DUT. Meanwhile D3 and D4 will also be ON, and equal amounts of current will flow from the buffer and DUT into the drain of MN2. The total current will be the programmed sink current. Note: if Isource=Isink then Ibuffer+IDUT=0.

When the DUT forces a voltage above VTT, device D2 will turn off and programmed ISOURCE current will flow from the drain of MP2 through D1 into the BUFFER. Meanwhile D3 will turn off and programmed ISINK current will flow from DUT through D4 and into the drain of MN2.

When the DUT forces a voltage below VTT, device D4 will turn off and the programmed source current will flow from the drain of MP2 through D2 to the DUT. Meanwhile, D1 will turn off and the programmed sink current will flow from the buffer, through D3 into the drain of MN2.

This is classical active load behavior and the power consumed can be described as follows:

When DUT>VTT, Power=Iprogrammed source*VCC−VEE+Iprogrammed sink*VDUT−VEE.

When DUT<VTT, Power=Iprogrammed source*VCC−VDUT+Iprogrammed sink*VCC−VEE.

Typical VCC−VEE is 12V and typical Iprogrammed is 24 mA.

Figure 2:
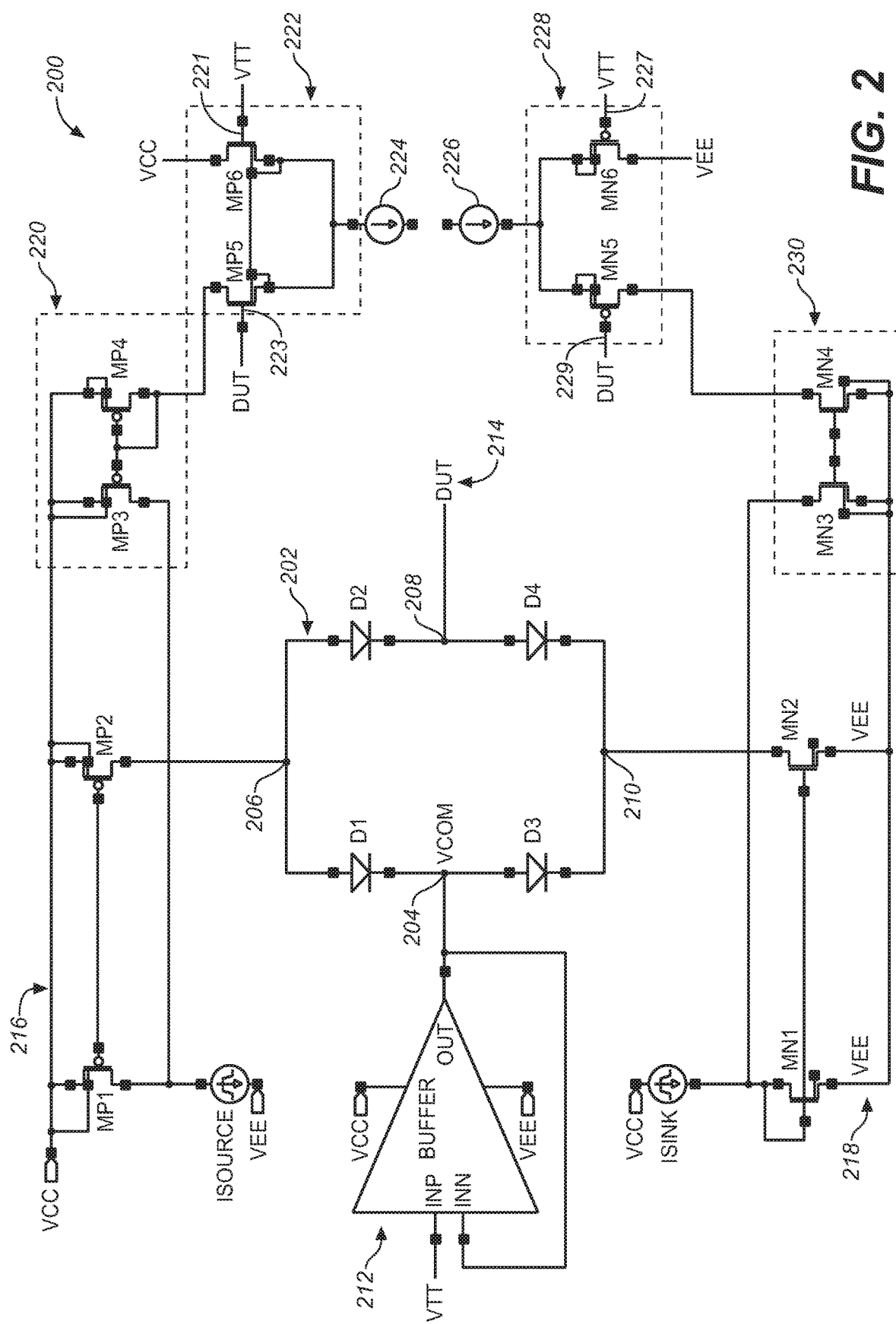
FIG. 2 illustrates the added circuit devices of MOSFET current mirrors, MN3, MN4 and MP3, MP4, and MOSFET differential pairs MN5, MN6 and MP5, MP6.

FIG. 2 is a schematic diagram of an embodiment 200 of an improved active load circuit of the present invention. Novelty resides in circuit devices and stages added to the prior art circuit shown in FIG. 1, including current mirrors MN3/MN4 202 and MP3/MP4 204 and differential pairs MN5/MN6 206 and MP5, MP6 208. That is, referring to FIG. 1, the circuit of FIG. 2 includes as points of novelty the two current mirrors, devices MN3 . . . MN6, and the two differential pairs, MP3 . . . MP6.

The embodiment of FIG. 2, 200 includes a diode bridge 202 formed of four diodes D1, D2, D3, and D4. The diode bridge 202 has a first node 204 between D1 and D3, a second node 206 between D1 and D2, a third node 208 between D2 and D4, and a fourth node 210 between D3 and D4. In this configuration, the first node 204 is in an opposing relationship to the third node 208, and the second node 206 is in an opposing relationship to the fourth node 210. A voltage buffer 212, configured to buffer an input voltage VTT, is connected with the first node 204. In this manner, the voltage available at the first node 204 is VCOM, which is an output of the voltage buffer 212.

In an embodiment, the voltage buffer 212 is a unity gain buffer, meaning that VCOM=VTT. A source current mirror 216, including MP1 and MP2, and identical to that of FIG. 1, is connected with the second node 206. The third node 208 is configured for connection with a DUT 214. Also, a sink current mirror 218, which includes MN1 and MN2, is connected with the fourth node 210.

In addition, a first current mirror 220 is connected with the source current mirror 216, and a second current mirror 230 is connected with the sink current mirror 218. As can be seen from FIG. 2, a first differential pair 222 is connected with the first current mirror 220, and a second differential pair 228 is connected with the second current mirror 230.

The first differential pair 222 is fed a first biasing current from a first constant current source 224. Further, the first differential pair 222 has a first input 221 and a second input 223. The first input 221 may be configured to be connected with the input voltage and the second input 223 may be configured for connection to the DUT 214. Similarly, the second differential pair 228 is fed a second biasing current from a second constant current source 226. Also, the second differential pair 228 has a third input 227 and a fourth input 229. The third input 227 may be configured for connection to the input voltage, and the fourth input 229 may be configured for connection to the DUT 214.

Preferably, the first and the second constant current sources 224 and 226 may be constant current circuits. There are a number of ways in which constant current circuits may be arranged: they may be resistor and/or transistor-based, and they may or may not include temperature compensation and voltage regulation. Further, a chain of connections between the source current mirror 216, the first current mirror 220, and the first differential pair 222 may follow a configuration selected from a group consisting of: (a) series-series connections, (b) series-parallel connections, (c) parallel-series connections, and (d) parallel-parallel connections, depending upon the specific requirements of the embodiment 200.

Similarly, a chain of connections between the sink current mirror 218, the second current mirror 230, and the second differential pair 228 may take a configuration selected from a group consisting of: (a) series-series connections, (b) series-parallel connections, (c) parallel-series connections, and (d) parallel-parallel connections, also depending upon the specific requirements of the embodiment 200.

It can also be seen from FIG. 2, that the first current mirror 220 and the first differential pair 222 each include a pair of transistors. The first current mirror 220 includes MP3 and MP4, and the first differential pair 222 includes MP5 and MP6. The pairs of transistors MP3/MP4 and MP5/MP6 of the first current mirror 220, and the first differential pair 222 may comprise MOSFET type transistors. More specifically, the MOSFET type transistors may be p-channel MOSFETS. Similarly, the second current mirror 230 and the second differential pair 228 each include a pair of transistors. The second current mirror 230 includes MN3 and MN4, and the second differential pair 228 includes MN5 and MN6. The pairs of transistors MN3/MN4 and MN5/MN6 of the second current mirror 230, and the second differential pair 228 may comprise MOSFET type transistors. However, in contrast to MP3/MP4 and MP5/MP6, the MOSFET type transistors MN3/MN4 and MN5/MN6 may be n-channel MOSFETS.

Figure 3:
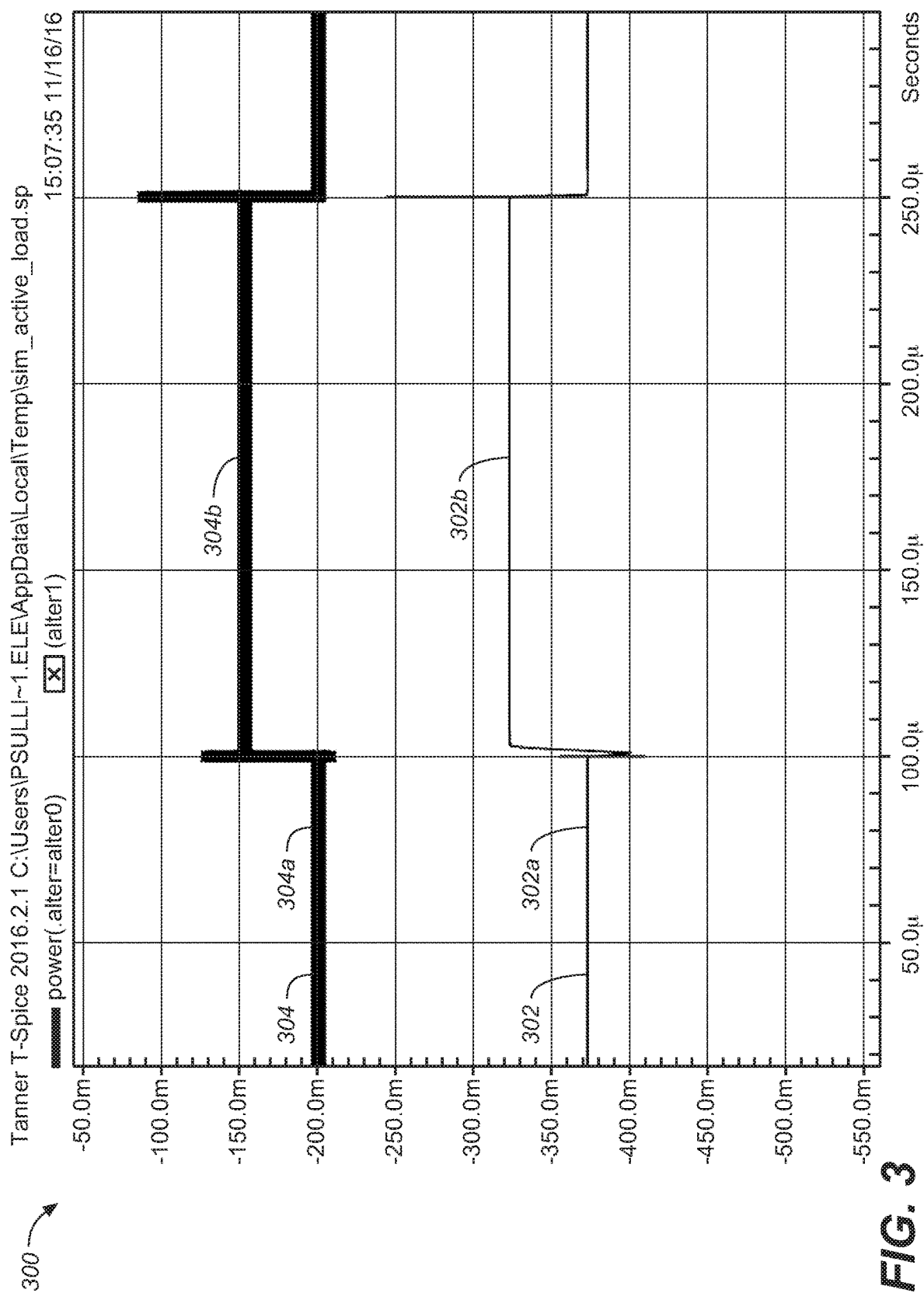
FIG. 3 illustrates a simulation comparing power dissipation of a standard active load and the lower power active load invention under source/sink conditions.

FIG. 3 is a graph 300 showing a simulation result comparing power dissipation 302 of a standard prior art active load with the power dissipation 304 for the low power active load invention under source/sink conditions. It is seen that the power dissipation is 375 mW for the prior art active load when source 24 mA into 0V 302a and 325 mW when sinking 24 mA from 6V 302b. The low power active load dissipates 200 mW 304a and 150 mW 304b, respectively, under the same conditions. Given that the goal for power per full pin electronics channel is on the order of 500 mW, this achieves a significant power savings.

The operation and advantages of the inventive low power active load circuit can be illustrated by way of example. Taking:

VCC=10V, VEE=−10V
VTT=VCOM=0 and DUT=1V
ISOURCE/ISINK programmed to 1 mA, which will generate 25 mA at the output.
Differential pair current sources, 224 and 226, set to 100 µA.

(1) The gains of MP2/MP1=25 and MN2/MN1=25 are commonly set to reduce power, as may be seen in the equations. (2) The gains of MP3/MP4=10 and MN3/MN4=10 are set to reduce overall power. (3) MP6 and MN6 drains may be left floating to reduce power by 2 mW, as in FIG. 2, but may impact AC performance.

Proper operation includes DUT at 1V, wherein normal operation predicts that the LOAD circuit will sink 25 mA from the DUT.

When DUT is above VTT, the current of 100 µA will flow towards the first current mirror 220 where it is amplified by a factor of 10. The second current mirror 230 generates 1 mA of current, which is further applied to the drain of MN1. This current is further amplified by a factor of 25 to generate 25 mA of current at its output. Since initially the diode D3 is forward biased due to VTT, the current of 25 mA flows from the drain of MN2 to the buffer. Thus, the total current from the buffer is 0 mA, since the current flows in the opposite direction of the current coming from the source current mirror 216.

Power in both the prior art active load circuit of FIG. 1 and the inventive low power active load circuit of FIG. 2 may thus be calculated as follows:

Power in FIG. 1:
A: 1 mA*(VCC−VEE)=1 mA*20V=20 mW
B: 1 mA*(VCC−VEE)=1 mA*20V=20 mW
C: 25 mA*(VCC−VEE)=25 mA*20V=500 mW
D: 25 mA*(VDUT−VEE)=25 mA*11V=275 mW
Power=815 mW Power in FIG. 2:
A: 1 mA*(VCC−VEE)=1 mA*20V=20 mW
B: 1 mA*(VCC−VEE)=1 mA*20V=20 mW
C: ~0 mA*(VCC−VEE)=~0 mA*20V=~0 mW
D: 25 mA*(VDUT−VEE)=25 mA*11V=275 mW
E: 100 uA*(VCC−VEE)=100 uA*20V=2 mW
F: 100 uA*(VCC−VEE)=100 uA*20V=2 mW
Power=319 mW The low power active load circuit of FIG. 2 achieves a 496 mW power savings on an extremely power sensitive device.

Also, note the following:

Current I(c) through the buffer is ~0 mA. This means the size of buffer can be significantly reduced, as the construction of high voltage high current devices requires extremely large devices.

DUT switching looks similar in waveform with lower power, so we can assume AC performance is acceptable.

DUT sources 25 mA, so there is acceptable DC performance.

The above description and illustrations should not be construed as limiting the scope of the invention, which is defined by the claims set out below.

What is claimed as invention is:

1. An active load circuit to execute tests on a Device Under Test (DUT), comprising:
   a diode bridge having a first node, a second node, a third node, and a fourth node, wherein the first node is opposite to the third node and the second node is opposite to the fourth node, and wherein a voltage buffer, configured to buffer an input voltage, is connected with the first node, a source current mirror is connected with the second node, and a sink current mirror is connected with the fourth node;
   a first current mirror connected with the source current mirror and a second current mirror connected with the sink current mirror;
   a first differential pair connected with the first current mirror, wherein the first differential pair is fed a first biasing current from a first constant current source, and further wherein the first differential pair has a first input and a second input; and
   a second differential pair connected with the second current mirror, wherein the second differential pair is fed a second biasing current from a second constant current source, and further wherein the second differential pair has a third input and a fourth input.

2. The active load circuit of claim 1, wherein the third node is configured for connection with the DUT.

3. The active load circuit of claim 1, wherein the first input is configured for connection with the input voltage and the second input is configured for connection with the DUT.

4. The active load circuit of claim 1, wherein the third input is configured to be connected with the input voltage and the fourth input is configured to be connected with the DUT.

5. The active load circuit of claim 1, wherein the first constant current source is a constant current circuit.

6. The active load circuit of claim 1, wherein the second constant current source is a constant current circuit.

7. The active load circuit of claim 1, wherein a chain of connections between the source current mirror, the first current mirror and the first differential pair follows a configuration selected from a group of series-series connections, series-parallel connections, parallel-series connections and parallel-parallel connections.

8. The active load circuit of claim 1, wherein a chain of connections between the sink current mirror, the second current mirror and the second differential pair follows a configuration selected from a group of series-series connections, series-parallel connections, parallel-series connections and parallel-parallel connections.

9. The active load circuit of claim 1, wherein the voltage buffer is a unity gain buffer.

10. The active load circuit of claim 1, wherein the first current mirror and the first differential pair comprises a pair of transistors each.

11. The active load circuit of claim 10, wherein the pairs of transistors of the first current mirror and the first differential pair comprise MOSFET type transistors.

12. The active load circuit of claim 11, wherein the MOSFET type transistors are p-channel MOSFETS.

13. The active load circuit of claim 1, wherein the second current mirror and the second differential pair comprises a pair of transistors each.

14. The active load circuit of claim 13, wherein the pairs of transistors of the second current mirror and the second differential pair comprise MOSFET type transistors.

15. The active load circuit of claim 14, wherein the MOSFET type transistors are n-channel MOSFETS.

16. An active load circuit for performing tests on a Device Under Test (DUT), comprising:
- a diode bridge having a first node, a second node, a third node, and a fourth node, wherein the first node is opposite to the third node and the second node is opposite to the fourth node, wherein a voltage buffer configured to buffer an input voltage, is connected with the first node, and a source current mirror is connected with the second node, the third node is configured to connect with the DUT, and a sink current mirror is connected with the fourth node;
- a first current mirror connected with the source current mirror and a second current mirror connected with the sink current mirror;
- a first differential pair connected with the first current mirror, wherein the first differential pair is fed a first biasing current from a first constant current source, and further wherein the first differential pair has a first input and a second input, wherein the first input is configured to connect with the input voltage and the second input is configured to connect with the DUT; and
- a second differential pair connected with the second current mirror, wherein the second differential pair is fed a second biasing current from a second constant current source, and further wherein the second differential pair has a third input and a fourth input, wherein the third input is configured to connect with the input voltage and the fourth input is configured to connect with the DUT.

* * * * *